United States Patent
Zahurak et al.

[11] Patent Number: 5,989,973
[45] Date of Patent: *Nov. 23, 1999

[54] SEMICONDUCTOR PROCESSING METHOD OF PROVIDING A CONDUCTIVELY DOPED LAYER OF HEMISPHERICAL GRAIN POLYSILICON AND A HEMISPHERICAL GRAIN POLYSILICON LAYER PRODUCED ACCORDING TO THE METHOD

[75] Inventors: John K. Zahurak; Klaus F. Schuegraf; Randhir P.S. Thakur, all of Boise, Id.

[73] Assignee: Micron Technology, Inc., Boise, Id.

[*] Notice: This patent is subject to a terminal disclaimer.

[21] Appl. No.: 08/820,712

[22] Filed: Mar. 18, 1997

Related U.S. Application Data

[63] Continuation of application No. 08/539,851, Oct. 6, 1995, Pat. No. 5,639,685.

[51] Int. Cl.$^6$ .............................................. H01L 21/8242
[52] U.S. Cl. ........................... 438/398; 438/396; 438/253; 438/255
[58] Field of Search ..................................... 438/255, 398, 438/665, 964, 253, 396, 397, 254; 257/309

[56] References Cited

U.S. PATENT DOCUMENTS

| | | | |
|---|---|---|---|
| 4,906,590 | 3/1990 | Kanetaki et al. | 437/249 |
| 5,037,773 | 8/1991 | Lee et al. | 437/977 |
| 5,290,729 | 3/1994 | Hayashide et al. | 437/977 |
| 5,340,765 | 8/1994 | Dennison et al. | 437/60 |
| 5,366,917 | 11/1994 | Watenabe et al. | 437/60 |
| 5,407,534 | 4/1995 | Thakur | 437/60 |
| 5,418,180 | 5/1995 | Brown | 437/60 |
| 5,444,013 | 8/1995 | Akram et al. | 437/60 |
| 5,518,948 | 5/1996 | Walker | 437/60 |
| 5,583,070 | 12/1996 | Liao et al. | 438/398 |
| 5,597,754 | 1/1997 | Lou et al. | 438/398 |
| 5,639,685 | 6/1997 | Zahurak et al. | 438/398 |
| 5,639,689 | 6/1997 | Woo | 438/398 |
| 5,696,014 | 12/1997 | Figura | 438/398 |
| 5,723,887 | 3/1998 | Tsuchimoto et al. | 438/398 |

FOREIGN PATENT DOCUMENTS

| | | | |
|---|---|---|---|
| 5175456 | 7/1993 | Japan | 437/977 |
| 6045521 | 2/1994 | Japan | 437/977 |

*Primary Examiner*—Carl Whitehead, Jr.
*Assistant Examiner*—Toniae M. Thomas
*Attorney, Agent, or Firm*—Wells, St. John, Roberts, Gregory & Matkin, P.S.

[57] ABSTRACT

A semiconductor processing method of providing a conductively doped layer of hemispherical grain polysilicon over a substrate includes, a) providing a layer of conductively doped silicon over the substrate to a thickness greater than about 200 Angstroms; b) depositing an undoped layer of non-polycrystalline silicon over the doped silicon layer to a thickness of from 100 Angstroms to about 400 Angstroms; c) positioning the substrate with the doped silicon and undoped non-polycrystalline silicon layers within a chemical vapor deposition reactor; d) with the substrate therein, lowering pressure within the chemical vapor deposition reactor to a first pressure at or below about 200 mTorr; e) with the substrate therein, raising pressure within the chemical vapor deposition reactor from the first pressure and flushing the reactor with a purging gas; f) with the substrate therein ceasing flow of the purging gas and lowering pressure within the chemical vapor deposition reactor to a second pressure at or below about 200 mTorr; and g) annealing the substrate having the deposited non-polycrystalline silicon layer in the presence of a conductivity enhancing impurity gas at an annealing temperature of from about 350° C. to about 600° C. and at an annealing pressure of from about $10^4$ Torr to about 80 Torr to in situ both diffuse conductivity enhancing impurity into the non-polycrystalline silicon layer and transform the non-polycrystalline silicon layer into a conductively doped hemispherical grain polysilicon layer.

6 Claims, 1 Drawing Sheet

SEMICONDUCTOR PROCESSING METHOD OF PROVIDING A CONDUCTIVELY DOPED LAYER OF HEMISPHERICAL GRAIN POLYSILICON AND A HEMISPHERICAL GRAIN POLYSILICON LAYER PRODUCED ACCORDING TO THE METHOD

RELATED PATENT DATA

This patent resulted from a continuation application of U.S. application Ser. No. 08/539,851, filed on Oct. 6, 1995 now U.S. Pat. No. 5,639,685, entitled "Semiconductor Processing Method Of Providing A Conductively Doped Layer of Hemispherical Grain Polysilicon And A Hemispherical Grain Polysilicon Layer Produced According To The Method" listing the inventors as John K. Zahurak, Klaus F. Schuegraf and Randhir P. S. Thakur.

TECHNICAL FIELD

This invention relates to the formation of hemispherical grain polysilicon films in semiconductor wafer processing.

BACKGROUND OF THE INVENTION

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the chip area. These include structures utilizing trench and stacked capacitors, as well as the utilization of new capacitor dielectric materials having higher dielectric constants.

One common material utilized for capacitor plates is conductively doped polysilicon. Such is utilized because of its compatibility with subsequent high temperature processing, good thermal expansion properties with $SiO_2$, and its ability to be conformally deposited over widely varying topography.

As background, silicon occurs in crystalline and amorphous forms. Further, there are two basic types of crystalline silicon known as monocrystalline silicon and polycrystalline silicon. Polycrystalline silicon, polysilicon for short, is typically in situ or subsequently conductively. doped to render the material conductive. Monocrystalline silicon is typically epitaxially grown from a silicon substrate. Silicon films deposited on dielectrics (such as $SiO_2$ and $Si_3N_4$) result in either an amorphous or polycrystalline phase. Specifically, it is generally known within the prior art that silicon deposited at wafer temperatures of less than approximately 580° C. will result in an amorphous silicon layer, whereas silicon deposited at temperatures higher than about 580° C. will result in a polycrystalline layer. The specific transition temperature depends on the source chemicals/precursors and the reactor used for the deposition.

The prior art has recognized that capacitance of a polysilicon layer can be increased merely by increasing the surface roughness of the polysilicon film that is used as a capacitor storage node. Such roughness is typically transferred to the cell dielectric and overlying polysilicon layer interfaces, resulting in a larger surface area for the same planar area which is available for the capacitor. One procedure utilized to achieve surface roughening involves deposition under conditions which are intended to inherently induce a rough or rugged upper polysilicon surface. Such include low pressure chemical vapor deposition (LPCVD) techniques. Yet, such prior art techniques are inherently unpredictable or inconsistent in the production of a rugged polysilicon film.

One type of polysilicon film which maximizes a roughened outer surface area is hemispherical grain (HSG) polysilicon, which is typically provided to a thickness of from 300 Angstroms to 400 Angstroms. Such can be deposited or grown by a number of techniques. One technique includes direct LPCVD formation at 590° C. Another includes formation by first depositing an amorphous silicon film at 550° C. using diluted $SiH_4$ (20%) gas at 1.0 Torr, followed by a subsequent high temperature transformation anneal. HSG polysilicon is typically not, however, in situ doped during its deposition due to undesired reduction in grain size in the resultant film or inherent failure of HSG to form. Accordingly, other methods are utilized to conductively dope the HSG polysilicon after its deposition. To provide such doping, an underlayer of heavily doped polysilicon can be provided, with subsequent doping of the HSG polysilicon layer occurring by an annealing step to drive the dopant into the HSG layer. Alternately, dopant can be implanted into the polysilicon after its deposition from above, although such may adversely affect grain shape having a tendency to smoothen the deposited HSG layer.

One example prior art method for providing doped HSG poly is as follows. A first doped layer of polysilicon is typically deposited to serve as a substrate for the HSG polysilicon. Then, a thin undoped amorphous layer of silicon is deposited. This layer is then subjected to an inert low pressure atmosphere, followed by a higher pressure atmosphere in the presence of a flowing purge gas, followed by exposure to another inert low pressure evacuation atmosphere. Subsequently, an annealing step is conducted in an inert atmosphere to transform the undoped amorphous silicon layer into undoped HSG polysilicon. Subsequent doping of the HSG layer can be accomplished by out-diffusion from the underlying polysilicon layer if it has previously been highly conductively doped. Alternately, ion implantation can be used to conductively dope the formed HSG layer.

The prior art has attempted to provide such HSG layers as being in situ conductively doped, but without much success. For example, the amorphous silicon layer from which the HSG polysilicon is produced has been deposited to be conductively doped. However, such dopants somehow adversely affect HSG grain growth as HSG polysilicon does not result from a subsequently conducted annealing step.

Accordingly, needs remain for producing HSG layers which are in is situ conductively doped during formation.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of providing a conductively doped layer of hemispherical grain polysilicon over a substrate comprises the following steps:

depositing a layer of non-polycrystalline silicon over the substrate to a thickness of less than or equal to about 400 Angstroms; and annealing the substrate having the deposited non-polycrystalline silicon layer within a chemical vapor deposition reactor in the presence of a conductivity enhancing impurity gas under conditions effective to situ both diffuse conductivity enhancing impurity into the layer and transform the silicon into a conductively doped hemispherical grain polysilicon layer.

Figure 1:
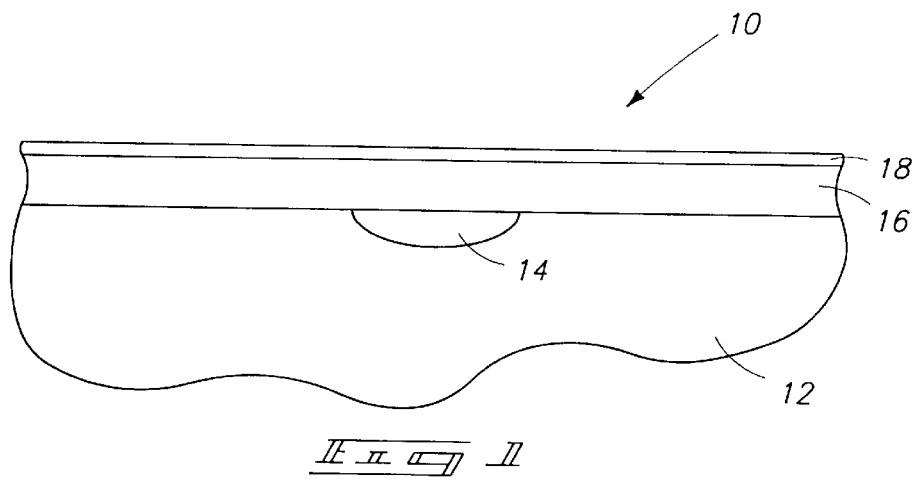
FIG. 1 is a diagrammatic sectional view of a semiconductor wafer fragment at one processing step in accordance with the invention.

Referring to FIG. 1, a semiconductor wafer fragment in process is indicated generally with reference numeral 10. Such is shown as comprising a bulk monocrystalline silicon substrate having an electrically conductive diffusion region 14 provided therein. A layer 16 of conductively doped silicon, preferably polysilicon or a silicide, is provided outwardly of bulk substrate 12 over diffusion region 14. Layer 16 is provided to a thickness of at least 200 Angstroms, with an example preferred thickness being 450 Angstroms. A layer 18 of non-polycrystalline silicon is conventionally deposited over substrate layer 16 to a thickness of from about 100 Angstroms to about 400 Angstroms. Non-polysilicon layer 18 will typically and preferably comprise amorphous a silicon, but might also include portions in a monocrystalline silicon phase. Ideally, layer 18 is completely undoped as deposited. Also preferably prior to deposition of layer 18, the outer surface of silicon layer 16 is subjected to a cleaning step, either within a chemical vapor deposition reactor or outwardly thereof, utilizing a dilute HF solution (i.e., 100:1) for 60 seconds. Such removes undesired impurities from layer 16.

Subsequently, the FIG. 1 wafer fragment 10 is prepared for an annealing step within a chemical vapor deposition reactor. Preferably, the just-described steps and subsequent steps are all conducted within the same chemical vapor deposition reactor without breaking vacuum. With the FIG. 1 substrate in a chemical vapor deposition reactor to be utilized for an annealing step, the substrate is preferably first subjected to a lowered first vacuum pressure of at or below about 200 mTorr. Thereafter, pressure within the chemical vapor deposition reactor is raised from the first pressure, and the reactor is flushed with a purging gas. An example pressure within the reactor during purging is 400 mTorr. Subsequently, flow of the purging gas is stopped and the reactor pressure is again lowered to some second pressure which is also preferably at or below about 200 mTorr. Such a treatment step serves to cleanse the reactor and wafer surface of impurities and better prepare the surface of the non-polycrystalline silicon layer for HSG formation.

Figure 2:
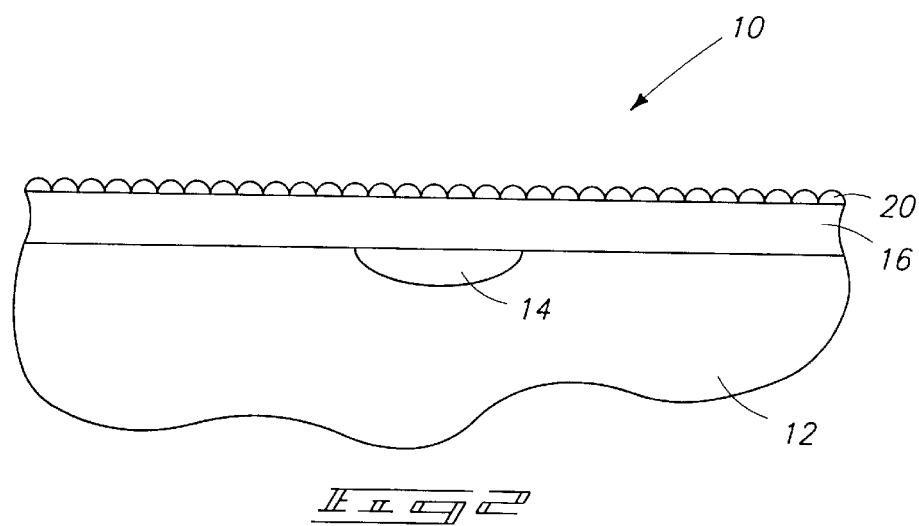
FIG. 2 is a view of the FIG. 1 wafer fragment at a processing step subsequent to that shown by FIG. 1.

Referring to FIG. 2, the wafer substrate is annealed in the presence of a conductivity enhancing impurity gas under conditions effective to in situ both diffuse conductivity enhancing impurity into layer 18 and transform the silicon therein into a conductively doped hemispherical grain polysilicon layer 20. The preferred wafer temperature during such annealing is at least about 350° C., with a range of from 550° C. to about 600° C. being most preferred. The preferred pressure range during the annealing is from about $10^{-4}$ Torr to about 80 Torr. Example gases for providing one of a desired p or n-type dopant impurity include $PH_3$, $AsH_3$, $B_2H_6$, $POCl_3$ and tertiary butyl phosphine. An example flow rate for any one of such gases during the in situ annealing treatment is from 30 to 60 sccm for a 44 liter chemical vapor deposition reactor. Chemical vapor deposition might be conducted by any of low pressure, rapid thermal, plasma-enhanced, or any combination of such techniques. Example annealing and in situ dopant treatment times are expected to be greater than five seconds for a cold-wall reactor, and greater than one minute for a hot-wall reactor. For example, in situ treating a 300 Angstroms thick layer of non-polycrystalline silicon using a $PH_3$ flow rate of 60 sccm in a cold-wall reactor for 10 to 20 minutes at 565° C. during anneal is expected to result in an HSG layer having a phosphorus dopant concentration of $10^{18}$–$10^{19}$ ions/cm$^3$. Thus, a technique is disclosed and described which includes in situ doping of an HSG layer of polysilicon during its inherent formation.

It may also be desirable to subject such in situ doped HSG polysilicon layer to subsequent diffusion doping. Specifically after formation, the conductivity enhancing dopant gas or other gas could continue to be fed to the reactor and the substrate temperature raised from the annealing temperature to a higher second temperature, with an example being 750° C. Such higher temperatures will facilitate driving of conductivity enhancing impurity dopants into the previously formed and in situ doped HSG layer.

Figure 3:
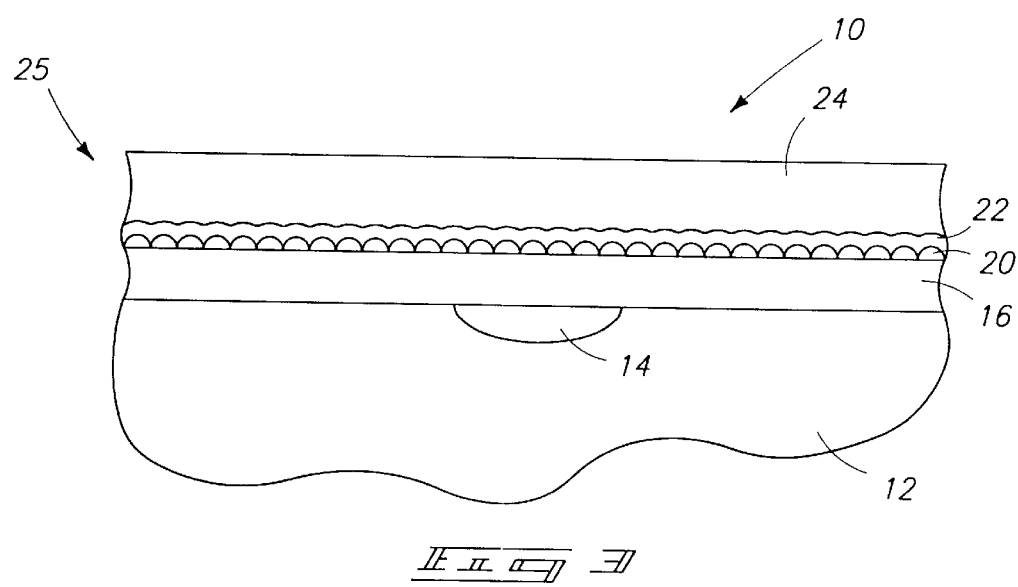
FIG. 3 is a view of the FIG. 1 wafer fragment at a processing step subsequent to that shown by FIG. 2.

Referring to FIG. 3, a subsequent capacitor dielectric layer 22 is deposited to a suitable thickness typically greater than 30 Angstroms. Examples include silicon nitride, silicon dioxide, tantalum pentoxide, titanium oxide, yttrium oxide, barium strontium titanate, combinations of these, and others. Subsequently, a conductive outer layer 24 is deposited to an example thickness of 750 Angstroms to complete inherent formation of a capacitor construction 25. The illustrated composite layers could of course be patterned to define the outlines of an isolated capacitor.

The above process can reduce time of processing due to in situ doping, and can enable elimination of a subsequent ion implanting step. Such will also result in a more uniformly doped and rougher HSG layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming conductively doped hemispherical grain polysilicon comprising annealing non-polycrystalline silicon within a chemical vapor deposition reactor in the presence of a conductivity enhancing impurity gas under conditions effective to in situ both diffuse conductivity enhancing impurity into the silicon and transform the silicon into conductively doped hemispherical grain polysilicon.

2. A method of forming conductively doped hemispherical grain polysilicon comprising annealing non-polycrystalline silicon in the presence of a conductivity enhancing impurity gas under conditions effective to in situ both diffuse conductivity enhancing impurity into the silicon and transform the silicon into a conductively doped hemispherical grain polysilicon.

3. A method of forming a capacitor comprising the following steps:

depositing a layer of non-polycrystalline silicon over a substrate;

annealing the substrate having the deposited non-polycrystalline silicon layer within a chemical vapor deposition reactor in the presence of a conductivity enhancing impurity gas under conditions effective to in situ both diffuse conductivity enhancing impurity into the layer and transform the silicon into a conductively doped hemispherical grain polysilicon layer;

forming a dielectric layer over the hemispherical grain polysilicon layer; and forming a conductive layer over the dielectric layer.

4. A method of forming a capacitor comprising the following steps:

annealing non-polycrystalline silicon in the presence of a conductivity enhancing impurity gas under conditions effective to in situ both diffuse conductivity enhancing impurity into the silicon and transform the silicon into a conductively doped hemispherical grain polysilicon;

forming a dielectric layer over the hemispherical grain polysilicon; and forming a conductive layer over the dielectric layer.

5. A semiconductor processing method of providing a conductively doped layer of hemispherical grain polysilicon over a substrate comprising the following steps:

providing a layer of conductively doped silicon over the substrate;

depositing an undoped layer of non-polycrystalline silicon over the doped silicon layer;

positioning the substrate with the doped silicon and undoped non-polycrystalline silicon layers within a chemical vapor deposition reactor;

with the substrate therein, lowering pressure within the chemical vapor deposition reactor to a first pressure at or below about 200 mTorr;

with the substrate therein lowering pressure within the chemical vapor deposition reactor to a second pressure at or below about 200 mTorr; and annealing the substrate having the deposited non-polycrystalline silicon layer in the presence of a conductivity enhancing impurity gas at an annealing temperature of from about 350° C. to about 600° C. and at an annealing pressure of from about $10^{-4}$ Torr to about 80 Torr.

6. A semiconductor processing method of providing a conductively doped layer of hemispherical grain polysilicon over a substrate comprising the following steps:

providing a layer of conductively doped silicon over the substrate to a thickness greater than about 100 Angstroms;

depositing an undoped layer of non-polycrystalline silicon over the doped silicon layer to a thickness of from 100 Angstroms to about 400 Angstroms;

positioning the substrate with the doped silicon and undoped non-polycrystalline silicon layers within a chemical vapor deposition reactor;

with the substrate therein, lowering pressure within the chemical vapor deposition reactor to a first pressure at or below about 200 mTorr;

with the substrate therein, raising pressure within the chemical vapor deposition reactor from the first pressure;

with the substrate therein lowering pressure within the chemical vapor deposition reactor to a second pressure at or below about 200 mTorr; and annealing the substrate having the deposited non-polycrystalline silicon layer in the presence of a conductivity enhancing impurity gas at an annealing temperature of from about 350° C. to about 600° C. and at an annealing pressure of from about $10^{-4}$ Torr to about 80 Torr to in situ both diffuse conductivity enhancing impurity into the non-polycrystalline silicon layer and transform the non-polycrystalline silicon layer into a conductively doped hemispherical grain polysilicon layer.

* * * * *

UNITED STATES PATENT AND TRADEMARK OFFICE
CERTIFICATE OF CORRECTION

PATENT NO : 5,989,973
DATED : November 23, 1999
INVENTOR(S) : John K. Zahurak et al.

It is certified that error appears in the above-identified patent and that said Letters Patent is hereby corrected as shown below:

On the 23rd line of the Abstract, please add a superscript "-" before the superscript 4.

Col. 2, line 48
 delete "is"

Col. 3, line 11
 please add "in" before "situ".

Col. 3, line 28
 delete "a"

Signed and Sealed this

Seventh Day of November, 2000

Q. TODD DICKINSON

Attest:

Attesting Officer

Director of Patents and Trademarks